US012646573B2

(12) United States Patent
Lee et al.

(10) Patent No.: US 12,646,573 B2
(45) Date of Patent: Jun. 2, 2026

(54) READ VOLTAGE LEVEL BIN SELECTION

(71) Applicant: Micron Technology, Inc., Boise, ID (US)

(72) Inventors: Eric N. Lee, San Jose, CA (US); Violante Moschiano, Avezzano (IT); Jeffrey S. McNeil, Nampa, ID (US); James Fitzpatrick, Laguna Niguel, CA (US); Sivagnanam Parthasarathy, Carlsbad, CA (US); Kishore Kumar Muchherla, Fremont, CA (US); Patrick R. Khayat, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 18/790,480

(22) Filed: Jul. 31, 2024

(65) Prior Publication Data

US 2024/0395338 A1 Nov. 28, 2024

Related U.S. Application Data

(62) Division of application No. 17/682,089, filed on Feb. 28, 2022, now Pat. No. 12,073,891.

(60) Provisional application No. 63/239,736, filed on Sep. 1, 2021.

(51) Int. Cl.
*G11C 16/30* (2006.01)
*G11C 16/10* (2006.01)
*G11C 16/26* (2006.01)

(52) U.S. Cl.
CPC ............ *G11C 16/30* (2013.01); *G11C 16/102* (2013.01); *G11C 16/26* (2013.01); *G11C 2207/2254* (2013.01)

(58) Field of Classification Search
CPC .................................................. G11C 116/30
USPC .................................................. 365/189.011
See application file for complete search history.

(56) References Cited

U.S. PATENT DOCUMENTS

| | | | | |
|---|---|---|---|---|
| 7,280,398 B1 * | 10/2007 | Lee | .......................... | G11C 5/02 365/185.11 |
| 11,238,953 B2 * | 2/2022 | Khayat | ........... | G11C 29/12005 |
| 2013/0033937 A1 * | 2/2013 | Aritome | ............. | G11C 16/0483 365/185.22 |
| 2015/0131376 A1 * | 5/2015 | Tsang | ................. | G11C 16/3404 365/185.24 |
| 2015/0313176 A1 | 11/2015 | Gelinas | | |
| 2016/0133333 A1 * | 5/2016 | Kumar | ................ | G11C 11/5642 365/185.24 |
| 2016/0133334 A1 * | 5/2016 | Zhang | ................. | G11C 11/5642 365/185.02 |

* cited by examiner

*Primary Examiner* — Muna A Techane
(74) *Attorney, Agent, or Firm* — Lowenstein Sandler LLP

(57) ABSTRACT

Processing logic in a memory device receives a calibration scan command associated with the memory device. In response to the calibration scan command, execution of a set of read operations at a plurality of read voltage levels on the memory device is caused. In response to the calibration scan command, a set of bit counts is identified, where each bit count of the set of bit counts corresponds to a respective bin of a set of bins associated with the plurality of read voltage levels. Based on the bit count corresponding to each bin of the set of bins, a bin having a lowest bit count is identified.

20 Claims, 10 Drawing Sheets

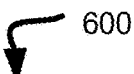
600

Issue an integrated calibration command to cause execution of a set of read operations at multiple read voltage levels corresponding to a programming distribution associated with a memory device
610

Determine a set of memory bit counts, where each memory bit count corresponds to a respective bin of a set of bins between respective pairs of read voltage levels of the plurality of read voltage levels
620

Identify a valley center bin having a minimum memory bit count of the set of memory bit counts
630

Perform a valley check operation to determine if the minimum memory bit count of the valley center bin satisfies a condition
640

Identify an adjusted read voltage level associated with the valley center bin in response to the condition being satisfied
650

FIG. 6

READ VOLTAGE LEVEL BIN SELECTION

CROSS-REFERENCE TO RELATED APPLICATIONS

This application is a divisional of U.S. patent application Ser. No. 17/682,089, titled "Integrated Command to Calibration Read Voltage Level," filed Feb. 28, 2022, which in turn claims the benefit of U.S. Provisional Application No. 63/239,736, titled "Integrated Command to Calibrate Read Voltage Level," filed Sep. 1, 2021, the entire disclosures of which are incorporated herein by reference.

TECHNICAL FIELD

Embodiments of the disclosure relate generally to memory sub-systems, and more specifically, relate to execution of an integrated command to calibrate a read voltage level in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2A-2C are schematics of portions of an array of memory cells as could be used in a memory of the type described with reference to FIG. 1B in accordance with one or more embodiments of the present disclosure.

FIG. 3 is a block schematic of a portion of an array of memory cells as could be used in a memory of the type described with reference to FIG. 1B, in accordance with one or more embodiments of the present disclosure.

FIG. 6 is a flow diagram of an example method of executing an integrated calibration command to determine an adjusted read voltage level corresponding to a valley portion relative to a default read voltage level, in accordance with one or more embodiments of the present disclosure.

DETAILED DESCRIPTION

Figure 1A:
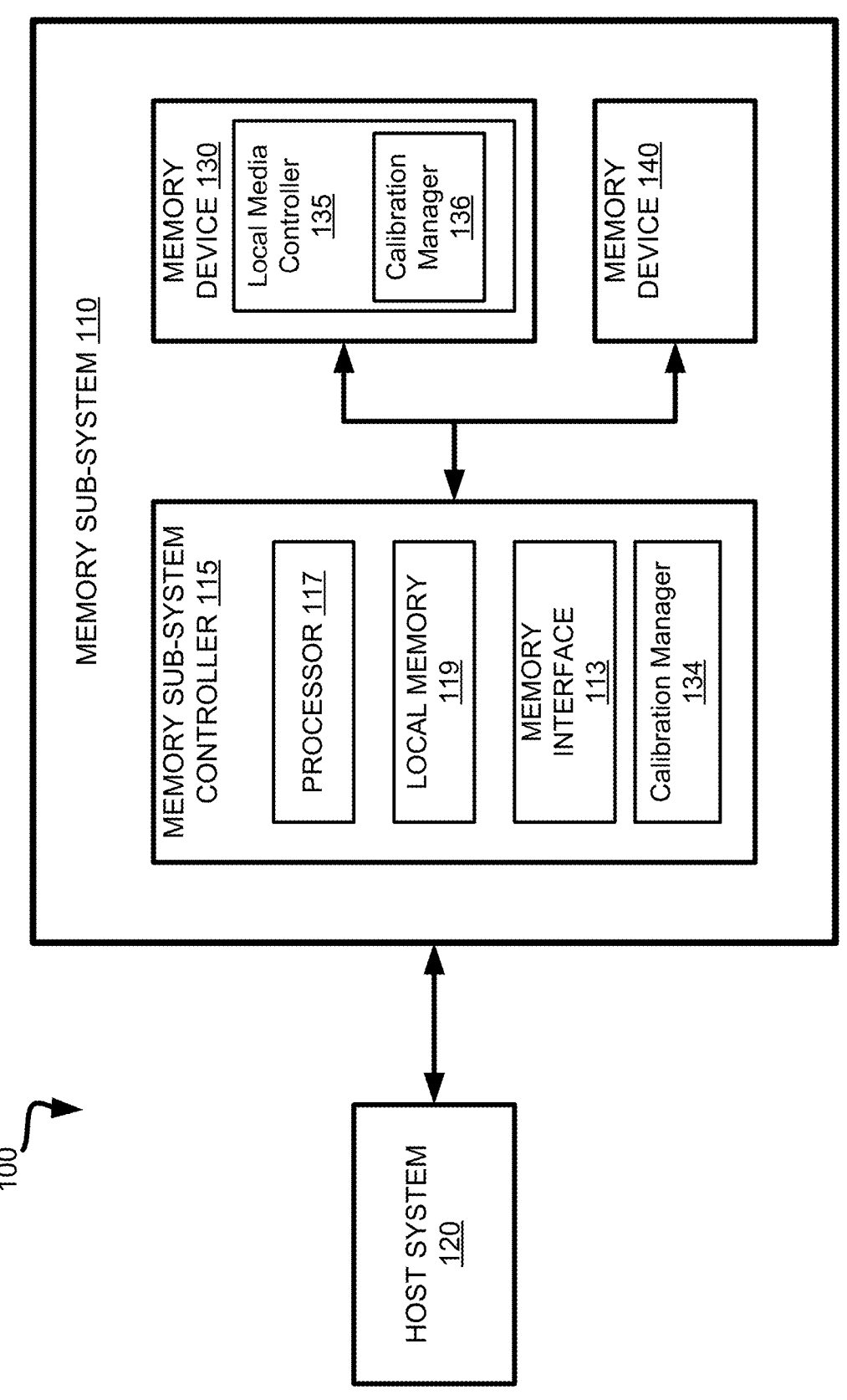
FIG. 1A illustrates an example computing system that includes a memory sub-system in accordance with one or more embodiments of the present disclosure.

Aspects of the present disclosure are directed to execution of an integrated command to calibrate a read voltage level in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

The memory sub-system can include multiple memory components that can store data from the host system in accordance with the multiple programming distributions. In order to establish and maintain the desired programming distributions associated with the respective programming levels, data integrity scans are performed.

In various systems, calibration is performed to determine an optimal or desired read threshold voltage corresponding to each of the programming distributions and integrity or health of the bits stored in the memory cells as represented by a read window budget (RWB) or valley margins associated the programming distributions. The calibration techniques can sample the margins between the programming distributions (also referred to as read threshold valleys or valleys) to determine if a desired valley margin or relative width between pairs of adjacent programming distributions is maintained. Valley margin can be correlated with the RWB, where the RWB for a valley can refer to an absolute measurement in volts (e.g., millivolts (mV)) between two adjacent programming distributions.

To monitor the integrity of the system, the memory sub-system can perform a data integrity check (also referred to herein as a "scan") to verify that the data stored at the data block remain at an adequate reliability level. During the data integrity check, a collection of read and/or write operations is invoked and one or more reliability statistics are determined for data stored at the data block. One example of a reliability statistic is a raw bit error rate (RBER). The RBER can be defined as the ratio of the number of erroneous bits to the number of all data bits stored in the data block.

In some systems, the data integrity scans are performed to determine one or more reliability statistics associated with the programming distributions. For example, an initial scan can be performed to measure the RBER of the system. If the initial scan returns an RBER that is higher than an acceptable error threshold level, the controller can perform a series of operations to calibrate the read threshold voltage levels to establish the desired programming distributions. In some systems, an auto read calibration (ARC) algorithm is performed using the measurement data from the high-frequency data integrity scan to center a valley of read threshold position when performing a read operation. For example, an ARC read operation is executed to identify where the optimal or ideal read level is within a valley associated with a programming or voltage level distribution. In this regard, a discrete command is issued and corresponding operations of the ARC processing are executed to identify the read voltage level corresponding to a center of a valley.

In addition, having identified an ideal or optimal read level within the valley, further commands and operations are used in a subsequent phase to scan or check the reliability statistic based on the identified read level. These further operations can identify the width of a valley margin for comparison with an acceptable valley margin threshold. In this further stage of the typical calibration processing, the size or margin of each valley is measured by issuing a sequence of read commands to determine the corresponding RWB. If these operations result in a determination that the read margin is not acceptable (e.g., the data is not reliable), the data is refreshed.

Each scan involves the above-identified series of commands and the execution of multiple operations on the memory device itself, which consumes bandwidth of the memory device and the transfer of data on the communication interface and bus (e.g., an ONFI interface). Accordingly, the typical calibration process includes the execution of the multiple stages including issuance of multiple discrete commands and the execution of multiple corresponding operations on the memory device which results in a substantial level of data transfer and consumption of bandwidth on the communication interface and channels.

Accordingly, the above-described approach disadvantageously requires the execution of multiple read operations during execution of the ARC and RWB measurements. Furthermore, the multi-stage processing with multiple commands results in the duplication of read operations during the ARC processing stage and the RWB measurement stage. In addition, the multi-stage calibration processing includes the issuing of multiple discrete commands which increases the command overhead and results in the execution of multiple operations (including duplicate operations). These multiple commands and operations produces a substantial amount of data transfer and additional stresses on the memory device which consumes bandwidth on the communication interface.

Aspects of the present disclosure address the above and other deficiencies by a process including a single, integrated command to enable and perform read level calibration processing. According to this approach, the single command (also referred to herein as an "integrated calibration command") can be implemented to generate calibration indications or hints that enable the identification of an optimal or adjusted read voltage level associated with one or more programming distributions of a memory device. In this regard, the previously used standalone commands associated with the ARC processing phase and RBER measurement phase are eliminated. According to embodiments, the integrated calibration command of the present disclosure causes the execution of multiple read operations at respective read voltage levels. The read voltage levels of the set of read operations include a default read voltage level ($Vread_0$), one or more read voltage levels at a lower offset relative to the default read voltage level (e.g., $Vread_{-1}$, $Vread_{-2}$, etc.) (herein referred to as a set of "lower offset levels") and one or more read voltage levels at higher offset levels relative to the default read voltage level (e.g., $Vread1$, $Vread2$, etc.) (herein referred to as a set of "higher offset levels") over a voltage range.

According to embodiments, a set of bins are identified between each respective pair of read voltage levels. Each bin corresponds to a voltage range between two adjacent read voltage strobes. For example, a first bin corresponds to a first voltage range between $Vread_{-2}$ and $Vread_{-1}$, a second bin corresponds to a second voltage range between $Vread_{-1}$ and $Vread_0$, and so on. A memory bit count is determined for each of the respective bins. The memory bit count represents a number of cells programed to a voltage within that range. A comparison of the memory bit counts corresponding to the bins is performed to identify a bin having a minimum bit count. In an embodiment, the minimum bit count corresponds to a bin with the fewest number of cells programmed to a voltage within that range compared to all of the other bins. In an embodiment, the bin having the minimum bit count is identified as a valley center bin (e.g., the region or portion corresponding to an estimated valley center corresponding to the programming distribution). In an embodiment, a representation of the memory bit count is generated. For example, the representation can include a data structure including a memory bit count corresponding to each bin or a histogram representing a memory bit count in each bin.

In an embodiment, the memory bit count of the identified valley center bin is compared to a valley margin threshold value to determine whether a condition is satisfied (also referred to as a "valley check" operation). In an embodiment, the condition is satisfied when the memory bit count of the identified valley center bin is less than the valley margin threshold value. In an embodiment, execution of the valley check operation and satisfaction of the condition indicates that the identified valley center has sufficient valley margin. In an embodiment, if the identified valley center fails the valley check operation, it is determined that the data is not reliable and a refresh operation can be performed.

In another embodiment, an aggregate memory bit count corresponding to the identified valley center bin and one or more adjacent bins is determined. For example, a first memory bit count associated with the identified valley center bin (e.g., Bin 2) can be added to a second memory bit count associated with a first additional bin to the left of the valley center bin (e.g., Bin 1) and a third memory bit count associated with a second additional bin to the right of the valley center bin (e.g., Bin 3). In an embodiment, the aggregate memory bit count is compared to the valley margin threshold value to determine if the condition is satisfied. In this embodiment, the condition is satisfied when the aggregate memory bit count is less than the valley margin threshold value, thereby indicating that the valley center bin has sufficient valley margin.

In an embodiment, an indication of the identified valley center that passed the valley check operation is provided by a local media controller to a memory sub-system controller. In an embodiment, using the identified valley center with acceptable valley margin, the memory sub-system controller identifies an optimal or adjusted read voltage level associated with the valley center. In an embodiment, the memory sub-system controller sets the adjusted read voltage level as the new or updated default read voltage level for use in a subsequent calibration scan. In another embodiment, the local media controller can determine the adjusted read voltage level corresponding to the identified valley center and provide information identifying the adjusted read voltage level to the memory sub-system controller.

Advantageously, the integrated command can be issued to enable the identification of a valley center and further determine whether the valley margin associated with that valley center is sufficient. The indication or hint of the identified valley center having sufficient valley margin (e.g., a valley center that passes the valley check operation) is used to determine an adjusted read voltage level for establishing desired programming distributions of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (also referred to as "controller 115") can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In an embodiment, the memory sub-system 110 includes at least a portion of a calibration manager 134 that can be used to perform operations relating to the integrated calibration command to identify a valley center, assess a valley margin of the identified valley center, and determine an optimal or adjusted read voltage level corresponding to the establishing of programming distributions associated with the memory device 130. In one embodiment, processing logic associated with the calibration manager can be included in both the memory sub-system controller 115 (i.e., calibration manager 134) and a local media controller 135 of the memory device 130 (i.e., calibration manager 136). In an embodiment, the calibration manager 134 is configured to issue an integrated calibration command to cause execution of multiple read operations at a set of different read voltage levels over a voltage range. In an embodiment, the set of read operations are performed at fixed voltage offsets or intervals over the voltage range, including a default or center read voltage level, one or more lower offset read voltage levels (e.g., the default read voltage level minus one or more offset amounts), and one or more higher offset read voltage levels (e.g., the default read voltage level plus one or more offset amounts), as illustrated in greater detail in the examples shown in FIGS. 4 and 5. A number of bins or buckets are identified between each neighboring pair of read voltage levels (e.g., where each bin corresponds to a voltage range between two adjacent read voltage levels). In an embodiment, a count of the memory bits within each bin is determined. In an embodiment, the calibration manager 136 identifies a bin having a lowest relative number of memory bits as a valley center bin.

In an embodiment, the calibration manager 136 performs a valley margin check associated with the identified valley center bin. In an embodiment, the calibration manager 136 compares the number of bits of the identified valley center bin to a valley margin threshold that represents a minimum number of bits that defines a valley that has sufficient margin for use in selection of an adjusted read voltage for confirming the reliability of the data during calibration. In an embodiment, the valley margin check can be based on a comparison of an aggregated memory bit count of the identified valley center bin and the bit count of one or more adjacent bins. If the number of bits in the valley center bin or aggregate count of a combination of bins is below the valley margin threshold level then the valley center bin passes the valley check and is identified as the optimal valley center.

In an embodiment, the calibration manager 134, 136 can determine an adjusted read voltage level corresponding to an identified valley center bin. In an embodiment, the adjusted read voltage level can be a voltage within the voltage range defining the bin (e.g., a voltage within the range between the two read voltage strobes defining the identified valley center bin). In an embodiment, the adjusted read voltage level can be determined by calculating an average of the two read voltage levels associated with the valley center bin. In an embodiment, the adjusted read level can be used for a subsequent calibration scan.

In one embodiment, the memory sub-system controller 130 includes at least a portion of the calibration manager 136 configured to carry out operations and functions associated with the integrated calibration command and related processing. In some embodiments, local media controller 135 includes at least a portion of the calibration manager 136 and is configured to perform portions of the functionality described herein. In some embodiments, the calibration manager 134, 136 is implemented on the memory sub-system 110 and memory device 130 using firmware, hardware components, or a combination of the above. Further details with regards to the operations of calibration manager 134, 136 are described below.

Figure 1B:
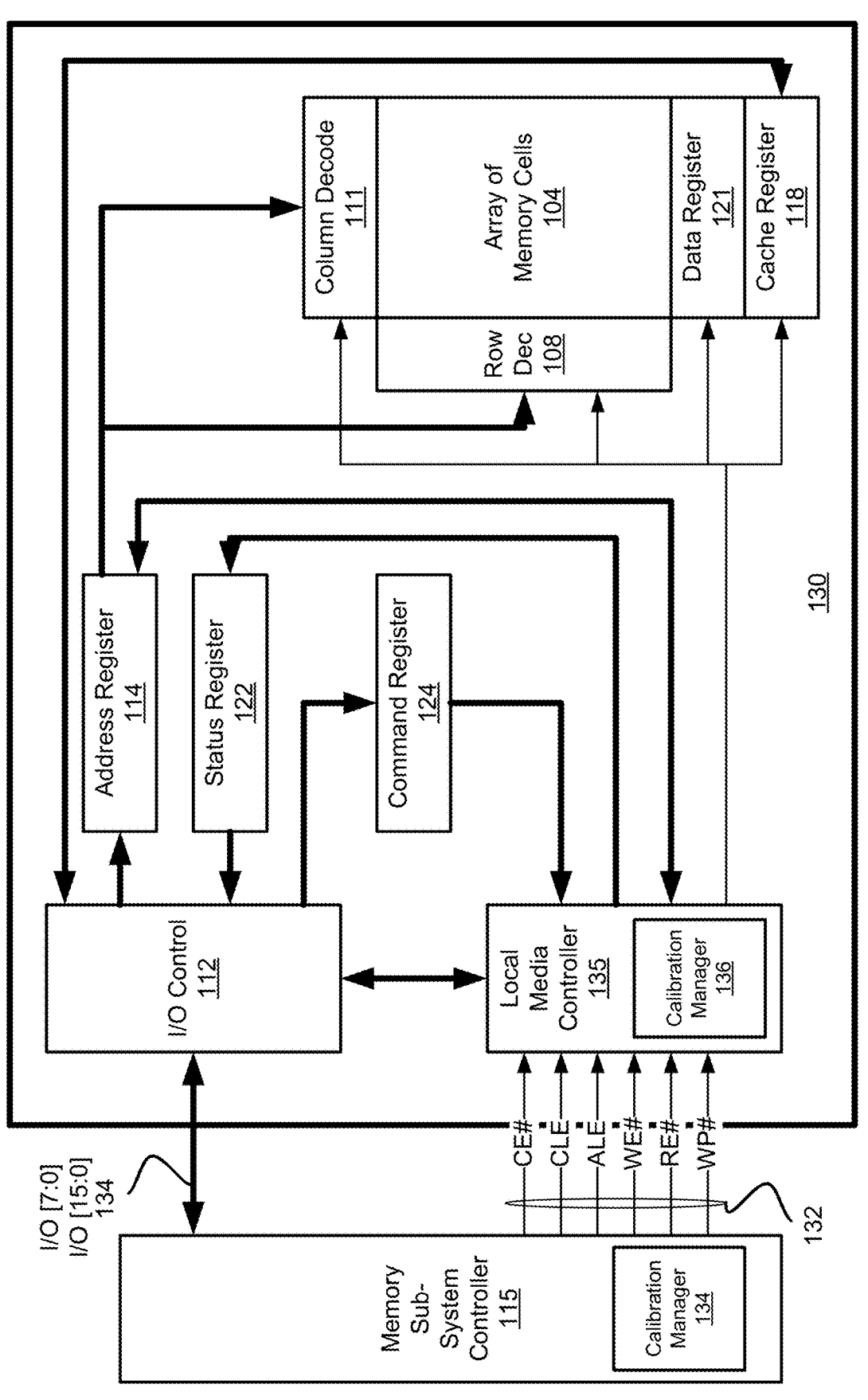
FIG. 1B is a block diagram of a memory device in communication with a memory sub-system controller of a memory sub-system in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 111 are provided to decode address signals. Address signals are received and decoded to access the array of memory cells 104. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses. In one embodiment, local media controller 135 includes at least a portion of the calibration manager 136, which can implement operations associated with an integrated calibration command issued by a portion of the calibration manager 134 of the memory sub-system controller 115, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 121 for transfer to the array of memory cells 104; then new data may be latched in the cache register 118 from the I/O control circuitry 112. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 104.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
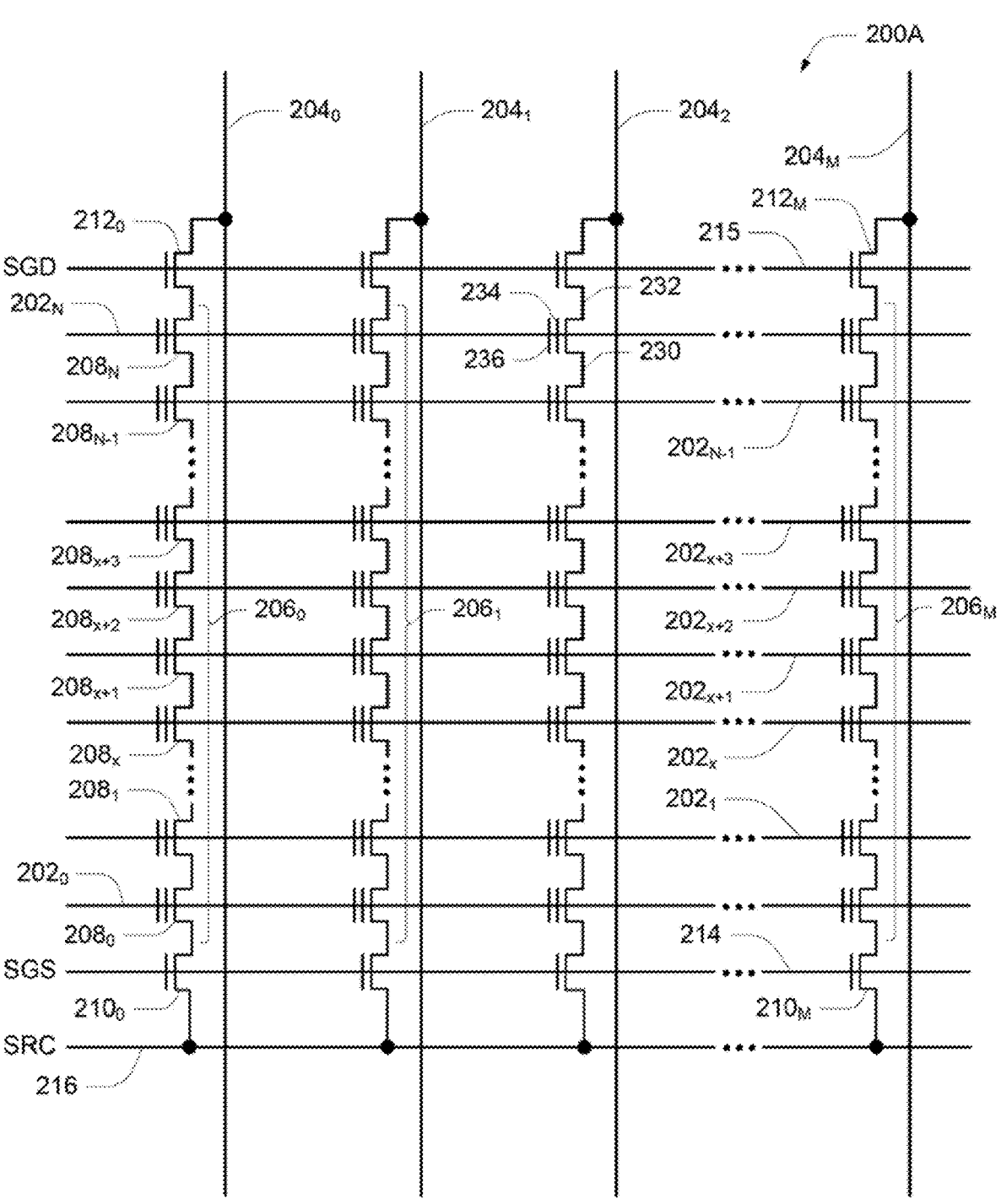
Figure 2B:
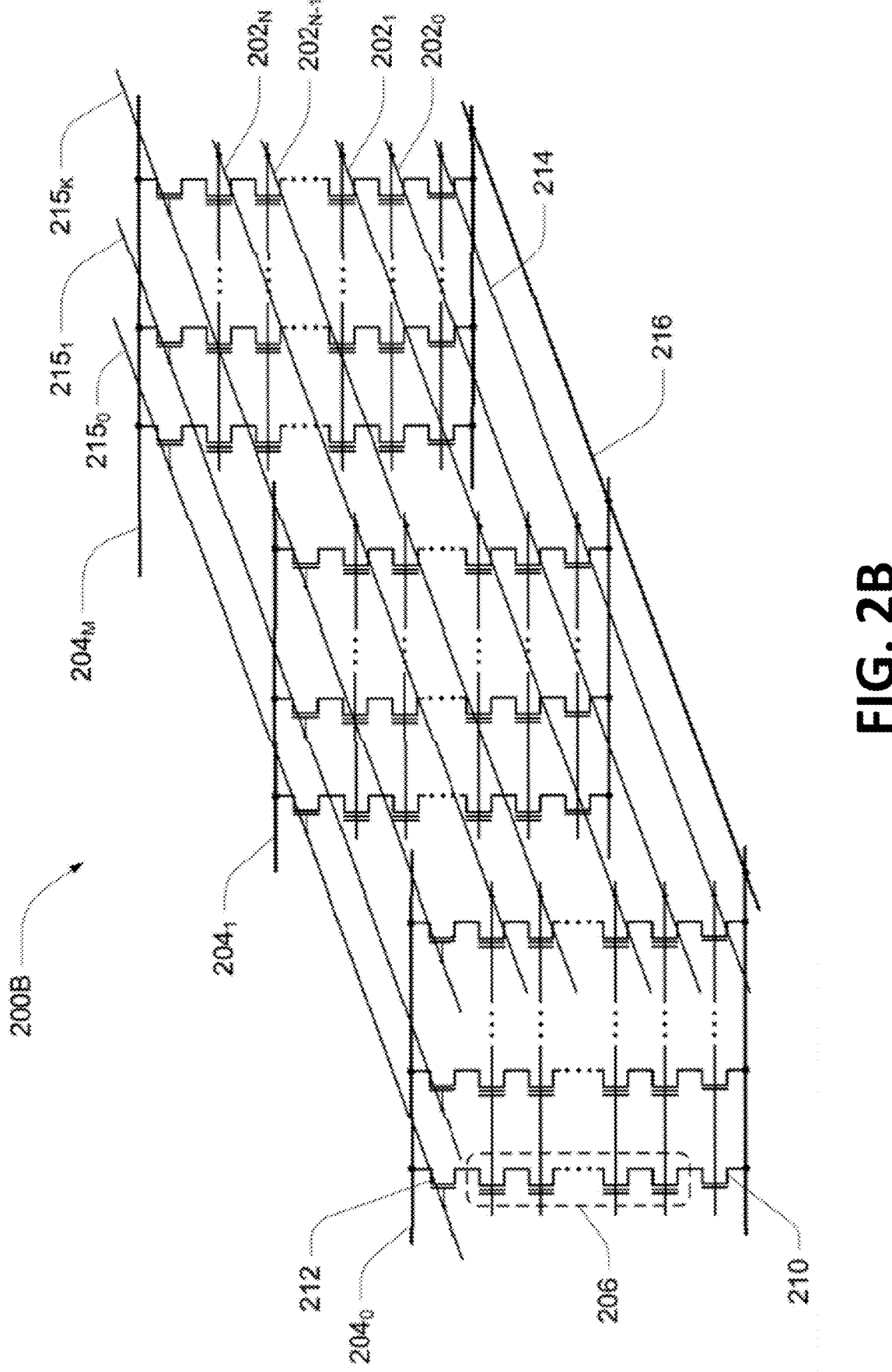
Figure 2C:
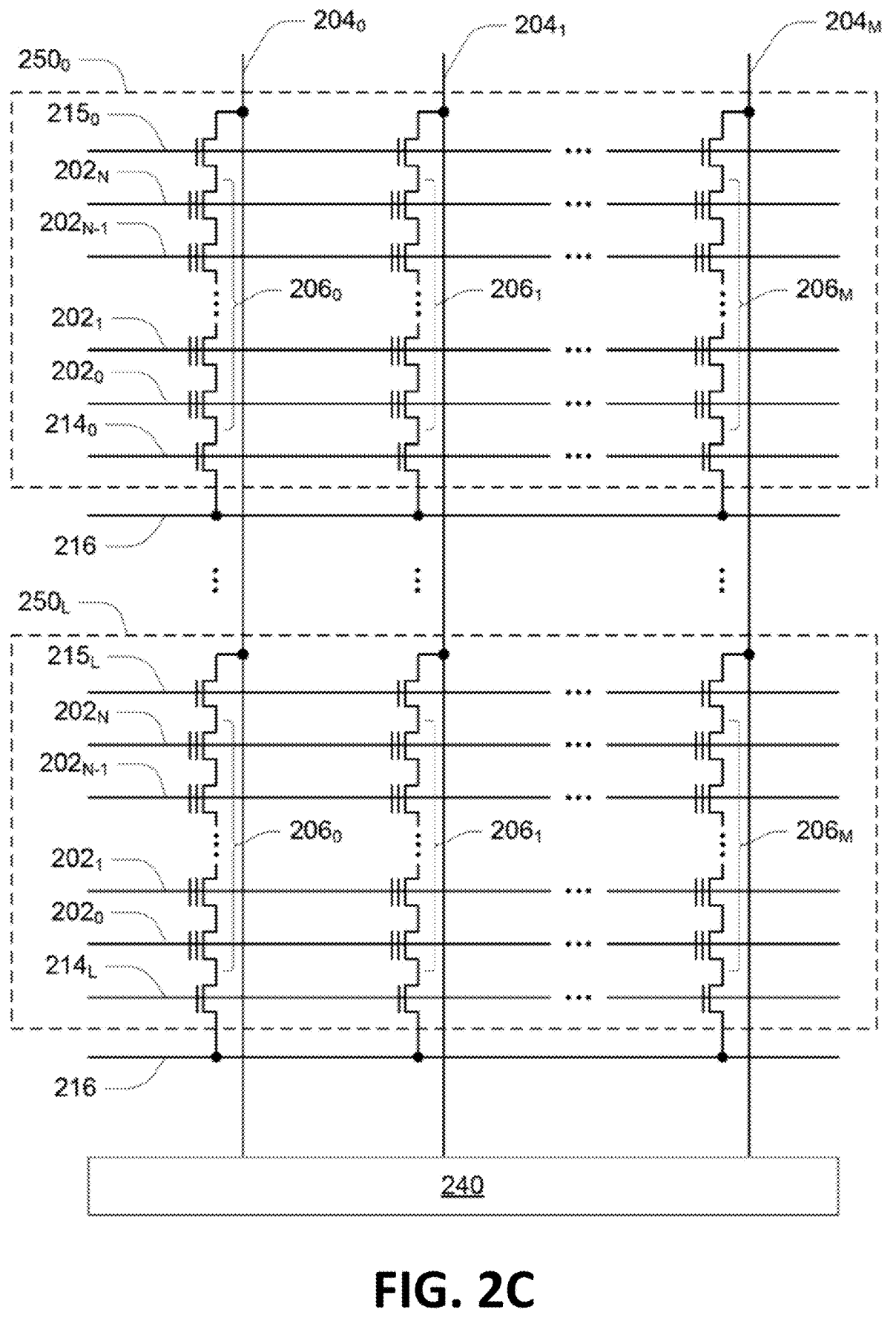

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bitlines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bitline 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to word line $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104 Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 3:
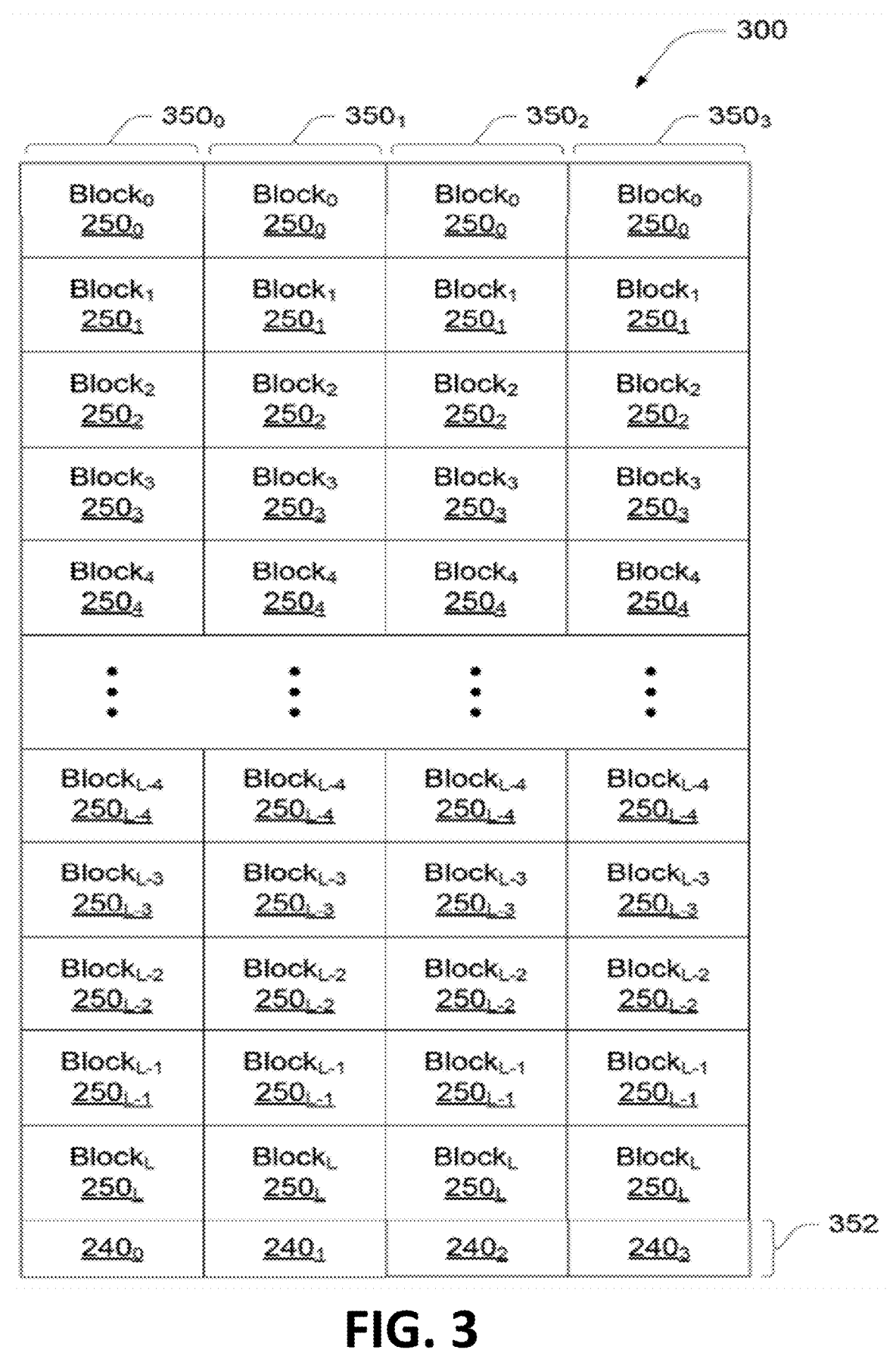

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
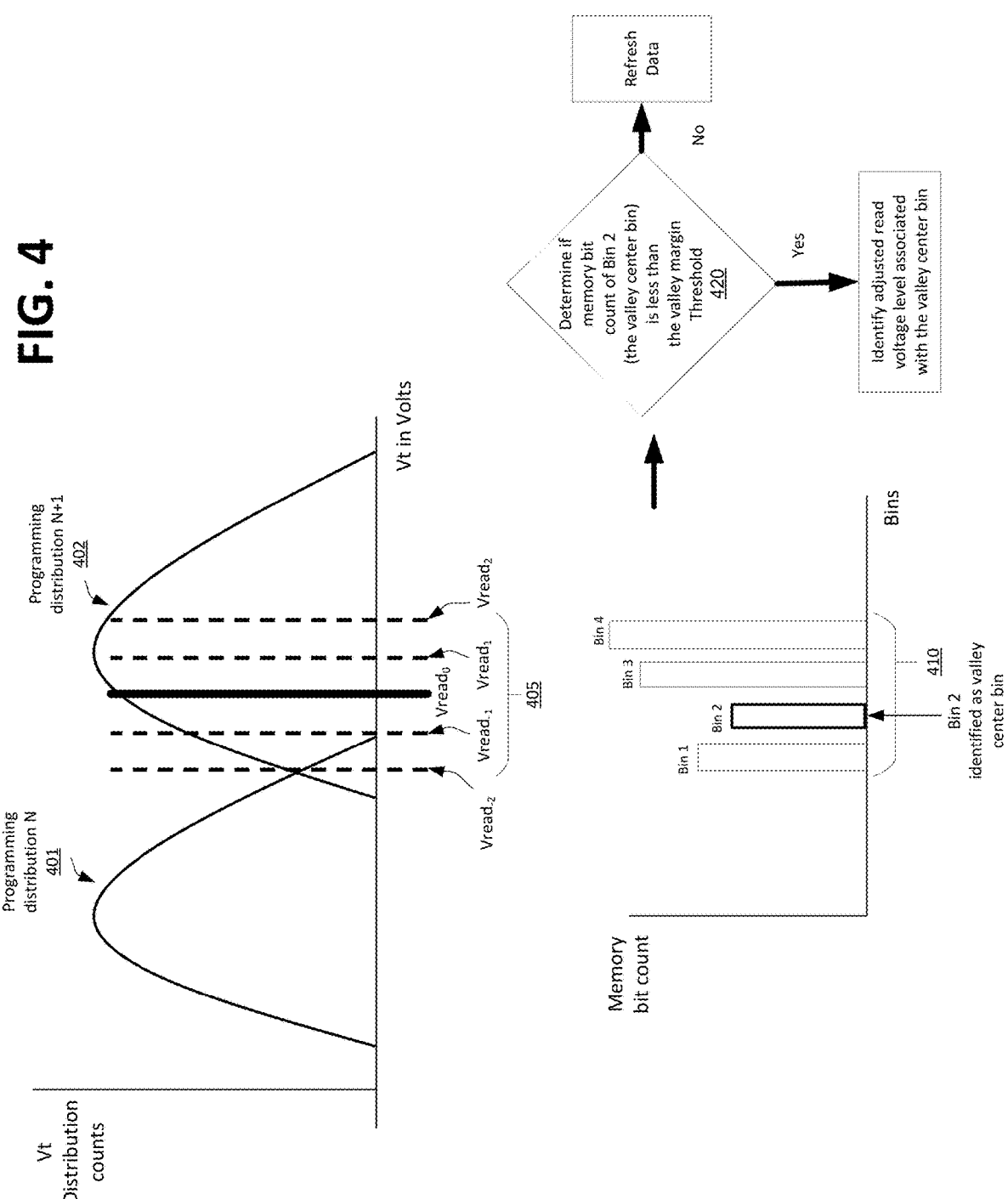
FIG. 4 illustrates example programming distributions to be calibrated in accordance with an integrated calibration command, according to an embodiment of the present disclosure.

FIG. 4 illustrates example programming distributions 401, 402 (programming distribution N and programming distribution N+1) to be calibrated in accordance with an integrated calibration command, according to an embodiment of the present disclosure. In an embodiment, the integrated calibration command is issued by processing logic of a memory sub-system (e.g., a calibration manager 134 of memory sub-system controller 115 of FIGS. 1A and 1B). In an embodiment, the integrated calibration command is received by processing logic of the local media controller (e.g., the calibration manager 136 of the local media controller 135 of FIGS. 1A and 1B), In the example shown, the integrated calibration command causes the execution of a set of multiple read operations or read voltage strobes to identify an optimal or adjusted read voltage level. In the example shown, the set of read operations includes a default read voltage (Vread$_0$) and a set of additional read operations at various offsets or intervals over a voltage range relative to the default read voltage.

In an embodiment, the set of additional read operations includes a first set of one or more read voltage strobes at one or more read voltage levels that are lower than the first read voltage level (e.g., Vref$_{-1}$, Vref$_{-2}$ . . . Vref$_{-N}$; where N is any suitable integer) and a second set of one or more read voltage strobes at one or more read voltage levels that are higher than the first read voltage level (e.g., Vref$_1$, Vref$_2$ . . . Vref$_M$; where M is any suitable integer) over a voltage range relative to the first read voltage level (Vref0). In an embodiment, one or more of N and M can have a value of 1, 2, etc.

In the example of FIG. 4, the set of read operations includes a first set of one or more lower offset read strobes (e.g., Vread$_{-2}$, Vread$_{-1}$) and a second set of one or more higher offset read strobes (e.g., Vread$_1$, and Vread$_2$). For example, a predefined interval or offset value (e.g., 0.3V, 0.5V, etc.) can be set and used to define the read voltage levels for Vread$_{-2}$, Vread$_{-1}$, Vread$_1$, and Vread$_2$, such that each read voltage level is separated by the predefined interval or offset value. In an example, with an offset value of 0.3V, Vread$_0$ can be set to 1.5V, Vread$_{-1}$ can be set to 1.2V, Vread$_{-2}$ can be set to 0.9V, Vread$_1$ can be set to 1.8V and Vread$_2$ can be set to 2.1V to establish a read voltage range of 0.9V to 2.1V.

In an embodiment, a set of buckets or bins 410 associated with the set of read voltage strobes are identified. In an embodiment, each bin is defined by a portion of one or more programming distributions corresponding to a voltage range between two adjacent read voltage strobes. In the example shown in FIG. 4, a first bin (Bin 1) is established between Vread$_{-2}$ and Vread$_{-1}$, a second bin (Bin 2) is established between Vread$_{-1}$ and Vread$_0$, a third bin (Bin 3) is established between Vread$_0$ and Vread$_1$ and a fourth bin (Bin 4) is established between Vread$_1$ and Vread$_2$.

In an embodiment, as illustrated in FIG. 4, in response to read operations caused by the integrated calibration command, a bit count is determined for each of the identified bins 410. For example, as illustrated by the example histogram of FIG. 4, a memory bit count corresponding to each bin is determined. As shown, Bin 1 has a first bit count, Bin 2 has a second bit count, Bin 3 has a third bit count and Bin 4 has a fourth bit count. In an embodiment, the bit count information associated with each bin can be represented in any suitable format or data structure (e.g., tabular format, histogram format, etc.). In an embodiment, the bit count for each bin can be reported (e.g., in histogram format) to the memory sub-system controller for further processing, as described herein.

In an embodiment, the processing logic (e.g., the calibration manager 134, 136 of either the local media controller 135 or the memory sub-system controller 115 of FIG. 1A) determines which of the set of bins 410 has a lowest or minima bit count (i.e., the bin or voltage range having the fewest number of programmed cells among the set of bins 410). The bin having the lowest bit count is identified as a valley center bin which indicates a valley portion relative to the default read voltage level (Vread$_0$). In the example shown in FIG. 4, Bin 2 is identified as the valley center bin since it has the lowest number of bits among the set of bins 410 (e.g., Bin 1, Bin 2, Bin 3 and Bin 4). In an embodiment, the identified valley center bin indicates a location or position of an optimal or adjusted read voltage level for calibration purposes. In an embodiment, the multiple read operations, determination of bit counts of the various bins 4190, and identification of the valley center bin in response to the integrated calibration command are performed prior to the determination of a reliability metric (e.g., RBER or RWB).

In an embodiment, the identified valley center bin (e.g., Bin 2 in FIG. 4) is checked to determine if the valley center bin corresponds to a sufficient valley margin. In an embodiment, the bit count of the valley center bin is compared to a valley margin threshold to determine if a condition is satisfied 420. In an embodiment, the condition 429 is satisfied (i.e., the valley check is passed) if the memory bit count of the valley center bin is less than the valley margin threshold. In an embodiment, the valley margin check is used to determine if the valley center bin represents an acceptable valley margin to be identified as an optimal valley for identification of an adjusted read voltage level.

In an embodiment, if the condition 420 is satisfied and the bit count of the valley center bin is below the valley margin threshold, an adjusted read voltage level associated with the valley center bin can be identified. In the example shown in FIG. 4, the adjusted read voltage level can be a voltage associated with Bin 2, such as, for example, a voltage within the range of Vread$_{-1}$ and Vread$_0$. In an embodiment, the adjusted read voltage level can be the average or mean voltage associated with the Vread$_{-1}$ to Vread$_0$ range. In an embodiment, the adjusted read voltage level can be a midpoint or center voltage value within the Vread$_{-1}$ to Vread$_0$ range. In an embodiment, the results of the valley margin check can be generated by processing logic of the calibration manager of the local media controller and provided to the memory sub-system controller for identification of the adjusted read voltage level in instances when the valley check passes.

In an embodiment, the processing logic of the calibration manager of the local media controller can determine the adjusted read voltage level associated with the identified valley center bin that passes the valley check and provided an indication of the adjusted read voltage level to the memory sub-system controller. In an embodiment, if the valley check fails (i.e., the bit count of the identified valley center bin is greater than or equal to the valley margin threshold), a determination is made that the data is unreliable and that the data is to be refreshed.

Figure 5:
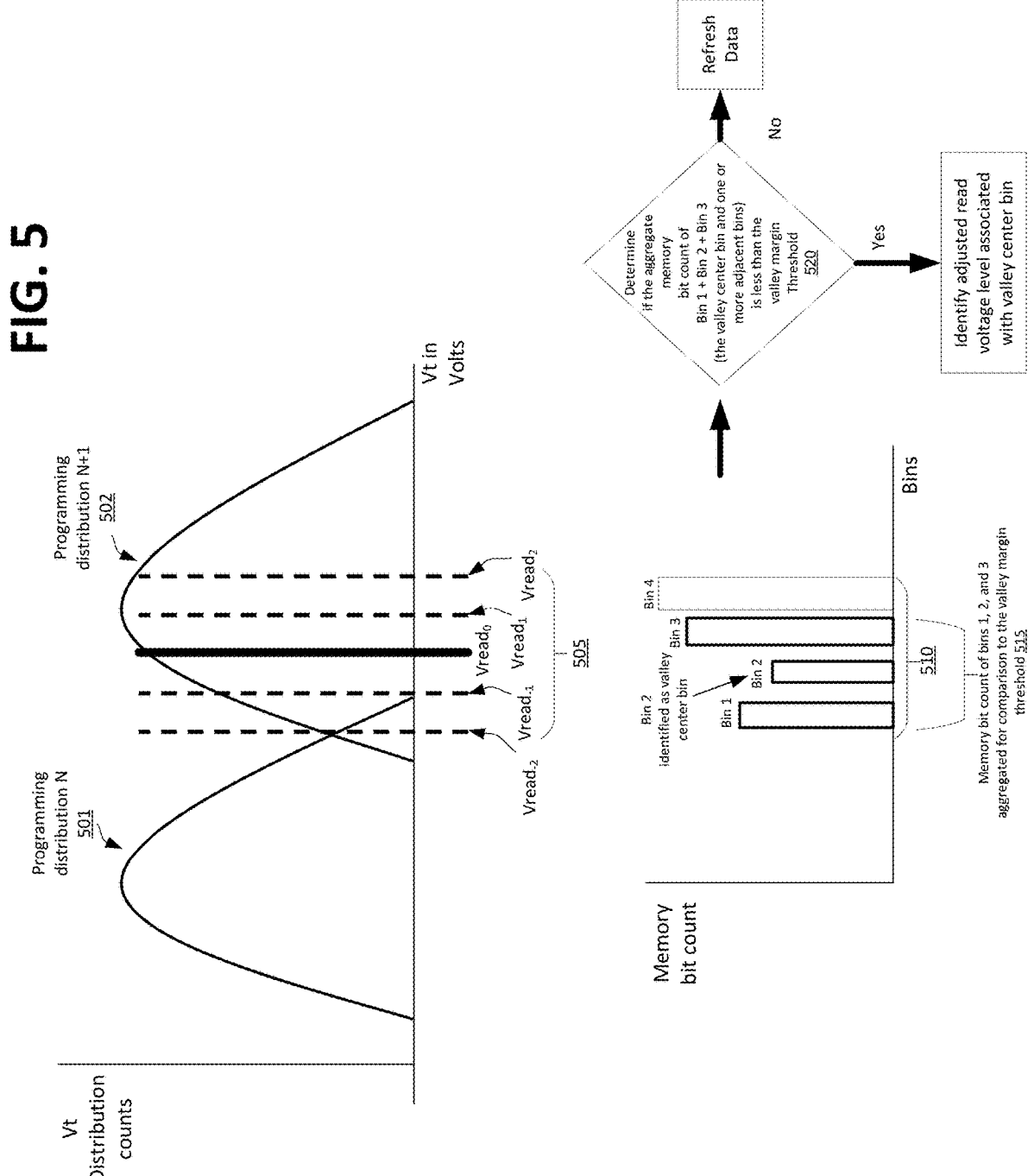
FIG. 5 illustrates example programming distributions to be calibrated in accordance with an integrated calibration command, according to an embodiment of the present disclosure.

FIG. 5 illustrates example programming distributions 501, 502 (programming distribution N and programming distribution N+1) to be calibrated in accordance with an integrated calibration command, according to another embodiment of the present disclosure. Like the processing illustrated in FIG. 4, an integrated calibration command is issued to cause the generation of multiple read operations using a set of read voltage levels 505 over a voltage range. As shown, the set of read operations use read strobes 505 having read voltage levels Vread$_{-2}$, Vread$_{-1}$, Vread$_0$, Vread$_1$, and Vread$_2$. As described above, a set of bins 510 (Bin 1, Bin 2, Bin 3, and Bin 4) are identified corresponding to portions of the one or more programming distributions between each adjacent pair of read voltage levels. In the example shown in FIG. 5, a first bin (Bin 1) is established between Vread$_{-2}$ and Vread$_{-1}$, a second bin (Bin 2) is established between Vread$_{-1}$ and Vread$_0$, a third bin (Bin 3) is established between $Vread_0$ and $Vread_1$ and a fourth bin (Bin 4) is established between $Vread_1$ and $Vread_2$.

In response to the integrated calibration command, the processing logic of the local media controller (e.g., calibration manager 134 of FIGS. 1A and 1B) determines a bit count for each of the bins of the set of bins 510. The respective bit counts corresponding to the set of bins 510 are compared to one another to identify a bin having the lowest relative number of bits, which is identified as the valley center bin.

Having identified the valley center bin (e.g., Bin 2 in FIG. 5), the processing logic performs a valley check based on an aggregated number of bits of the valley center bin and one or more adjacent bins 515, according to an embodiment. In this embodiment, the respective bit count of one or more additional bins are added to the bit count of the valley center bin to determine an aggregated bit count 515. In an embodiment, the valley check is performed using the aggregate bit count to determine if sufficient valley margin is detected at 520. In an embodiment, the aggregate bit count (e.g., the sum of the bit count of Bin 1, the bit count of Bin 2 (the valley center bin), and the bit count of Bin 3) is compared to a valley margin threshold to determine if a condition is satisfied 520. In an embodiment, the condition 520 is satisfied (i.e., the valley check passes) if the aggregated bit count is less than the valley margin threshold. In this example, a first adjacent bin corresponding to a lower voltage range relative to the valley center bin and a second adjacent bin corresponding to a higher voltage range relative to the valley center bin are selected. It is noted that any suitable number of adjacent bins can be used to determine the aggregate bit count. In an embodiment, an asymmetric set of adjacent bins (e.g., where the number of bins to the left of the valley center bin does not equal the number of bins to the right of the valley center bin) is selected for use in determining the aggregate bit count.

In an embodiment, as shown in FIG. 5, if the valley check passes (i.e., the aggregate memory bit count is less than the valley margin threshold), an adjusted read voltage level associated with the valley center bin is identified and used in further calibration processing. As shown in FIG. 5, if the valley center bin fails the valley check (i.e., the aggregate memory bit count is greater than or equal to the valley margin threshold), the data is considered unreliable and a refresh operation is performed. Advantageously, the valley check determination associated with the identified valley center bin can be used to provide indications or hints to the memory sub-system controller as to an estimated valley location and associated read voltage level for use in the calibration process, without placing a significant traffic on the communication interface (e.g., ONFI-related traffic).

FIG. 6 is a flow diagram of an example method of executing an integrated calibration command to generate an indication of a valley center position for the identification of an adjusted read voltage level in accordance with the calibration of programming distributions associated with a memory device, in accordance with one or more embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by calibration manager 134 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a command is issued. For example, processing logic (e.g., calibration manager 134) can issue an integrated calibration command to cause execution of a set of read operations at multiple read voltage levels corresponding to a programming distribution associated with a memory device. In an embodiment, the set of read operations include the application of multiple read voltage strobes at set of read voltage levels. In an embodiment, the set of read voltage levels includes a default or initial read voltage level ($Vread_0$), a set of one or more lower offset read voltage levels (e.g., $Vread_{-1}$ or $Vread_{-1}$ to $Vread_{-N}$), and a set of one or more higher offset read voltage levels (e.g., $Vread_1$ or $Vread_1$ to $Vread_M$). In an embodiment, set of one or more lower offset read voltage levels include read levels that are a lower voltage relative to the default read voltage level ($Vread_0$). For example, $Vread_{-1}$ can be equal to $Vread_0 - V_{offset}$; $Vread_{-2}$ can be equal to $Vread_0 - (2 \times V_{offset})$, and so on, where Voffset is a predetermined or preset offset voltage value (e.g., 0.1V, 0.2V, 0.3V, etc.). In an embodiment, set of one or more higher offset read voltage levels include read levels that are a higher voltage relative to the default read voltage level ($Vread_0$). For example, $Vread_1$ can be equal to $Vread_0 + V_{offset}$; $Vread_2$ can be equal to $Vread_0 + (2 \times V_{offset})$, and so on.

At operation 620, memory bit counts are determined. For example, the processing logic can determine a set of memory bit counts, where each memory bit count corresponds to a respective bin of a set of bins between respective pairs of read voltage levels of the multiple read voltage levels. In an embodiment, a bin is defined as a portion of one or more programming distributions between each adjacent pair of read voltage levels of the read operations. For example, for a set of read operation including read levels of $Vread_0$, $Vread_{-1}$, $Vread_{-2}$, $Vread_1$, and $Vread_2$, a first bin is identified between $Vread_{-2}$ and $Vread_{-1}$, a second bin is identified between $Vread_{-1}$ and $Vread_0$, a third bin is identified between $Vread_0$ and $Vread_1$ and a fourth bin is identified between $Vread_1$ and $Vread_2$. In an embodiment, a count of the memory bits within each respective bin is determined.

At operation 630, a valley center is made. For example, the processing logic can identify a valley center bin having a minimum memory bit count of the set of memory bit counts. In an embodiment, the set of memory bit counts are compared to determine which bin has the lowest relative bit count. The bin with the lowest bit count is identified as the valley center bin which represents an estimated location or position of a valley portion relative to the default read voltage level ($Vread_0$). In an embodiment, a representation of the bit count associated with the set of bins can be generated (e.g., a histogram, a table, etc.) and provided by the local media controller to the memory sub-system controller for further processing.

At operation 640, a determination is made. For example, the processing logic can perform a valley check operation to determine if the minimum memory bit count of the valley center bin satisfies a condition. In an embodiment, the condition is satisfied when the minimum memory bit count of the valley center bin is less than a valley margin threshold. In an embodiment, the valley check operation is used to determine if the identified valley center bin has an adequate level of sufficient valley margin to provide for reliable data metrics (e.g., RWB or RBER reliability).

In another embodiment, as shown in FIG. 5, the valley check operation can be performed using an aggregate memory bit count associated with the valley center bin and one or more adjacent bins. For example, a first memory bit count of the valley center bin (e.g., Bin 2 in FIG. 5) can be added to a second memory bit count of an adjacent lower offset bin (e.g., Bin 1 in FIG. 5) and a third memory bit count of an adjacent higher offset bin (e.g., Bin 3 in FIG. 5) to generate an aggregate memory bit count. The aggregate memory bit count can then be compared to the valley margin threshold to determine if the condition is satisfied (e.g., whether the valley check passes or fails).

In operation 650, a read voltage level is identified. For example, the processing logic can identify an adjusted read voltage level associated with the valley center bin in response to the condition being satisfied. In an embodiment, the adjusted read voltage level is a voltage within the voltage range associated with the valley center bin. For example, as shown in FIG. 4, the adjusted voltage level can be a voltage within the range of Vread$_{-1}$ and Vread$_0$. In an embodiment, the adjusted voltage level can be a midpoint or average of the voltages within the range associated with the valley center bin (e.g., a midpoint between Vread$_0$ and Vread$_{-1}$). In an embodiment, the adjusted read voltage level can be identified by processing logic of the memory sub-system controller based on the memory count and valley check information provided by the local media controller. In an embodiment, the adjusted read voltage level can be identified by processing logic of the local media controller, which in turn provides information identifying the adjusted rad voltage level to the memory sub-system controller for use as a new or updated default read voltage level in a subsequent scan operation.

Advantageously, process 600 enables the setting of an adjusted read voltage level for the calibration of a memory device with an integrated (single) command that minimizes the latency of data integrity scan commands as compared to typical calibration processes. According to embodiments, operations 610, 20, 630, 640, and 650 are performed in response to the integrated calibration command. In this regard, the number of commands issued to the memory device is minimized for more efficient calibration processing. Furthermore, the reduced latency can be repurposed to expand the read voltage search window that can further reduce calibration scan inefficiencies. The reduced latency further allows for accelerated calibration scan rates without impacting performance or quality of service metrics.

Figure 7:
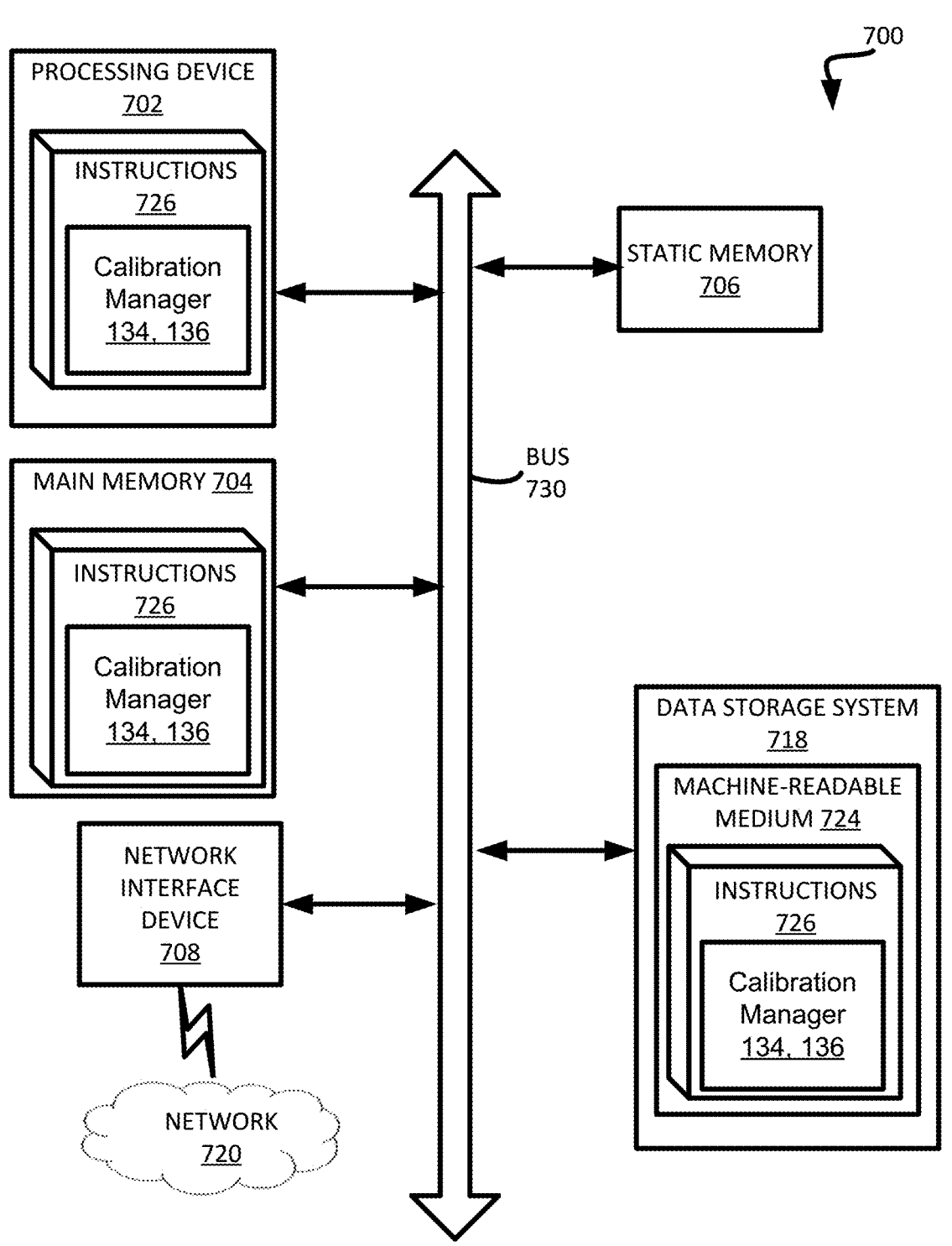
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to calibration manager 134 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to calibration manager 134 of FIGS. 1A and 1B). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a set of memory cells; and
processing logic, operatively coupled with the memory array, to perform operations comprising:
 receiving a calibration scan command;
 causing, in response to the calibration scan command, execution of a set of read operations at a plurality of read voltage levels on the memory device;
 identifying, in response to the calibration scan command, a set of bit counts, wherein each bit count of the set of bit counts corresponds to a respective bin of a set of bins associated with the plurality of read voltage levels; and
 identifying, based on the bit count corresponding to each bin of the set of bins, a bin having a lowest bit count.

2. The memory device of claim 1, the operations further comprising determining the bin having the lowest bit count satisfies a condition.

3. The memory device of claim 2, wherein the condition is satisfied when the lowest bit count of the bin is less than a valley margin threshold.

4. The memory device of claim 3, the operations further comprising identifying an adjusted read voltage level associated with the bin having the lowest bit count.

5. The memory device of claim 4, the operations further comprising receiving a subsequent calibration scan command to cause execution of a set of read operations comprising a first read operation at the adjusted read voltage level.

6. The memory device of claim 1, the operations further comprising determining an aggregate bit count based on a sum of the lowest bit count of the bin and one or more additional bit counts associated with one or more additional bins.

7. The memory device of claim 6, the operations further comprising:
determining the aggregate bit count is less than a valley margin threshold; and
identifying an adjusted read voltage level associated with the bin having the lowest bit count.

8. A method comprising:
receiving a calibration scan command associated with a memory device;
causing, in response to the calibration scan command, execution of a set of read operations at a plurality of read voltage levels on the memory device;
identifying, in response to the calibration scan command, a set of bit counts, wherein each bit count of the set of bit counts corresponds to a respective bin of a set of bins associated with the plurality of read voltage levels; and
identifying, based on the bit count corresponding to each bin of the set of bins, a bin having a lowest bit count.

9. The method of claim 8, further comprising determining the bin having the lowest bit count satisfies a condition.

10. The method of claim 9, wherein the condition is satisfied when the lowest bit count of the bin is less than a valley margin threshold.

11. The method of claim 10, further comprising identifying an adjusted read voltage level associated with the bin having the lowest bit count.

12. The method of claim 11, further comprising receiving a subsequent calibration scan command to cause execution of a set of read operations comprising a first read operation at the adjusted read voltage level.

13. The method of claim 8, further comprising determining an aggregate bit count based on a sum of the lowest bit count of the bin and one or more additional bit counts associated with one or more additional bins.

14. The method of claim 13, further comprising:

determining the aggregate bit count is less than a valley margin threshold; and identifying an adjusted read voltage level associated with the bin having the lowest bit count.

15. A non-transitory computer readable medium comprising instructions, which when executed by a processing device, cause the processing device to perform operations comprising:

receiving a calibration scan command associated with a memory device;

causing, in response to the calibration scan command, execution of a set of read operations at a plurality of read voltage levels on the memory device;

identifying, in response to the calibration scan command, a set of bit counts, wherein each bit count of the set of bit counts corresponds to a respective bin of a set of bins associated with the plurality of read voltage levels; and identifying, based on the bit count corresponding to each bin of the set of bins, a bin having a lowest bit count.

16. The non-transitory computer readable medium of claim 15, the operations further comprising determining the bin having the lowest bit count satisfies a condition, wherein the condition is satisfied when the lowest bit count of the bin is less than a valley margin threshold.

17. The non-transitory computer readable medium of claim 16, the operations further comprising identifying an adjusted read voltage level associated with the bin having the lowest bit count.

18. The non-transitory computer readable medium of claim 17, the operations further comprising receiving a subsequent calibration scan command to cause execution of a set of read operations comprising a first read operation at the adjusted read voltage level.

19. The non-transitory computer readable medium of claim 15, the operations further comprising determining an aggregate bit count based on a sum of the lowest bit count of the bin and one or more additional bit counts associated with one or more additional bins.

20. The non-transitory computer readable medium of claim 19, the operations further comprising:

determining the aggregate bit count is less than a valley margin threshold; and identifying an adjusted read voltage level associated with the bin having the lowest bit count.

* * * * *